(12) United States Patent
Merrill

(10) Patent No.: US 7,110,028 B1
(45) Date of Patent: Sep. 19, 2006

(54) ELECTRONIC SHUTTER USING BURIED LAYERS AND ACTIVE PIXEL SENSOR AND ARRAY EMPLOYING SAME

(75) Inventor: Richard B. Merrill, Woodside, CA (US)

(73) Assignee: Foveon, Inc., Santa Clara, CA (US)

( * ) Notice: Subject to any disclaimer, the term of this patent is extended or adjusted under 35 U.S.C. 154(b) by 953 days.

(21) Appl. No.: 10/218,505

(22) Filed: Aug. 13, 2002

(51) Int. Cl.
 *H04N 5/335* (2006.01)
(52) U.S. Cl. ...................... 348/294; 348/308
(58) Field of Classification Search ............. 348/294, 348/308, 314; 257/389, 392, 393, 394, 395, 257/398, 399, 400; 438/223, 224, 252, 226
See application file for complete search history.

(56) References Cited

U.S. PATENT DOCUMENTS 5,202,907 A * 4/1993 Yonemoto .................. 377/60
5,965,875 A * 10/1999 Merrill ...................... 250/226
6,369,853 B1 * 4/2002 Merrill et al. .............. 348/302
2002/0058383 A1 * 5/2002 Mancini et al. ............ 438/286

OTHER PUBLICATIONS

N. Slevanovic et al., "MP 6.2 A CMOS Image Sensor for High-Speed Imaging", *2000 IEEE International Solid State Circuits Conference*, pp. 104-105, Feb. 2000.

* cited by examiner

*Primary Examiner*—Vivek Srivastava
*Assistant Examiner*—Nelson D. Hernandez
(74) *Attorney, Agent, or Firm*—Sierra Patent Group, Ltd.

(57) ABSTRACT

An electronic shutter switching transistor for a CMOS electronic is formed in a semiconductor substrate of a first conductivity type. The transistor comprises a pair of spaced apart doped regions of a second conductivity type opposite the first conductivity type disposed in the semiconductor substrate forming source/drain regions. A gate is disposed above and insulated from the semiconductor substrate and is self aligned with the pair of spaced apart doped regions. A well of the second conductivity type laterally surrounds the pair of spaced apart doped regions and extends deeper into the substrate than the doped regions. A buried layer of the second conductivity type underlies and is in contact with the well.

22 Claims, 11 Drawing Sheets

ELECTRONIC SHUTTER USING BURIED LAYERS AND ACTIVE PIXEL SENSOR AND ARRAY EMPLOYING SAME

BACKGROUND OF THE INVENTION

1. Field of the Invention

The present invention relates to electronic cameras. More particularly, the present invention relates to CMOS electronic cameras with electronic shutters and to an improved electronic shutter using buried layers.

2. The Prior Art

Electronic cameras using imaging arrays are known in the art. Both CCD and CMOS imagers have been employed in such cameras.

Some electronic cameras that employ CMOS active pixel sensors have employed such sensors equipped with an "electronic shutter" feature. The use of an electronic shutter is desirable because it eliminates the need for a mechanical shutter, reducing cost and complexity while improving the problem of latency between triggering an exposure and capturing an exposure. Electronic shutters in CMOS active pixel sensor arrays usually come in one of two forms: a rolling shutter or a true simultaneous shutter. A rolling shutter operates by successively exposing and resetting rows of pixels in the sensor. This type of shutter results in either a different total exposure time for pixels in different rows, or exposure to light from a scene at different points in time for the pixels in different rows. In either case, the resulting image can suffer from noticeable artifacts, particularly if objects in the scene are moving. A true simultaneous electronic shutter allows all pixels of the array to be exposed to incident light for the same period of time, thereby permitting an accurate and simultaneous snapshot of an entire scene. For quality images, a true simultaneous electronic shutter is the preferred method. The true simultaneous electronic shutter feature is usually implemented in CMOS active pixel sensors by providing a switching transistor disposed between the output of the photodiode photosensor and an amplifier associated with the pixel sensor.

Such an arrangement is shown in FIG. 1 in which photodiode 10 is shown coupled to reset transistor 12. The electronic shutter in the active pixel sensor of FIG. 1 is implemented as transistor 14, sometimes referred to as a transfer transistor, disposed between the cathode of photodiode 10 and the gate of the source-follower amplifier transistor 16. The source of source-follower amplifier transistor 16 is coupled to an output column line 18 of the array through a row-select transistor 20, whose gate is driven by one of the row lines 22 in the array.

As known in the art, the pixel sensor of FIG. 1 is operated by first turning on the reset transistor 12 to drive the cathode of photodiode 10 to a known potential. The transfer transistor is also turned on during this reset period to charge the gate of transfer transistor 16 (also referred to as the sense node) to a known voltage. When the reset signal at the gate of reset transistor 12 is de-asserted, integration of photogenerated charges begins. When it is desired to end the exposure, transfer transistor 14 is turned off. At this time, a signal voltage representing the accumulated photo-generated charge may be driven onto column line 18 by asserting a row-select signal on row-select line 22 and thereby turning on the row select transistor 20.

Large electric fields associated with the transfer transistor 14 in the active pixel sensor of FIG. 1 cause undesirable leakage paths (shown as dashed-line resistors 24 in FIG. 1) and the relatively large capacitances (shown as dashed-line capacitors 26) inherent in the circuit cause reduced sensitivity.

One of the fundamental limitations of electronic shutters implemented in electronic cameras using advanced CMOS is the need to place the shutter switch in a heavily doped surface well. This requirement stems from the need to isolate the shutter switch from substrate photocurrent. FIG. 2A is a diagram of a semiconductor cross-section of a portion of a CMOS active pixel sensor, showing the effects of failure to provide surface well isolation for the transfer transistor. As shown in FIG. 2A, failure to provide such isolation between the photodiode comprising n+ region 30 in lightly-doped p-type substrate 32, and the n+ source/drain regions 34 and 36 of the transfer transistor allows a leakage path for stray charge carriers (illustrated by the electron designated e− in FIG. 2A) to drift into the n+ source/drain regions 34 and 36 of the transfer transistor.

Several techniques, illustrated in FIGS. 2B and 2C, have been employed to provide a barrier for blocking the leakage currents shown in FIG. 2A. In FIGS. 2B and 2C, structures corresponding to structures illustrated in FIG. 2A will be referred to using the same reference numerals used to identify those structures in FIG. 2A.

FIG. 2B is a diagram of a semiconductor cross-section of a portion of a CMOS active pixel sensor, showing the effects of use of a p-well and p-substrate barrier for isolation of the source/drain regions 34 and 36 of the transfer transistor. For the case shown in FIG. 2B, the transfer transistor is an NMOS device. In FIG. 2B, the n+ source/drain regions 34 and 36 are disposed in p-well 38, doped to about 1e17, a higher doping level than p-type substrate 32, shown doped to a level of about 1e15. The more highly doped p-well region tends to repel the electrons as shown by the curved arrow in FIG. 2B. By repelling electrons, the p-well/p-substrate structure provides a barrier to isolate the source/drain regions 34 and 36 of transfer transistor.

FIG. 2C is a diagram of a semiconductor cross-section of a portion of a CMOS active pixel sensor, showing the effects of use of an n-well barrier for isolation for the transfer transistor. The transfer transistor is now a PMOS device formed in the n-well. In FIG. 2C, the p+ source/drain regions 34 and 36 are disposed in n-well 40, doped to about 1e17. The n-well in FIG. 2C acts as a collection point for the electrons as indicated by the long curved arrow. Electrons are drawn to the positive supply V+ and therefore do not disturb the p+ source/drain regions. In this manner, the n-well structure provides a barrier to isolate the source/drain regions 34 and 36 of the transfer transistor.

NMOS and PMOS surface-well-isolated versions of electronic shutters that are shown in FIGS. 2B and 2C provide isolation from the substrate but the surface wells are required to be more heavily doped than the substrate in order to provide effective isolation and also control of surface concentrations. Furthermore, as CMOS scaling advances, n-wells and p-wells that are available as a natural part of the process become very heavily doped, in the range of 1e17 to 1e18. These high doping levels result in larger electric fields, particularly if signal voltages compatible with competitive imager dynamic range are used. Large electric fields in the shutter switch cause high leakage and low sensitivity as shown in FIG. 1. Because the photodiode charge collection node is to be connected to the electronic switch, the high leakage current and low sensitivity may limit the ability to do high quality long exposures with an electronic shutter of the types shown in FIG. 2. In addition, leakage current is a major source of noise in electronic image sensors, and as such it has a direct impact on dynamic range and image quality for all types of exposures.

Compatibility with advanced CMOS processes, the ability to perform long exposures, better noise and dynamic range performance, as well as eliminating the need for a mechanical shutter in a camera system are all important reasons for an improved electronic shutter technique.

BRIEF DESCRIPTION OF THE INVENTION

An electronic shutter employed in a CMOS image sensor employs a buried layer to isolate the electronic shutter switch from the substrate on which the image sensor is formed. The electronic shutter of the present invention permits true simultaneous electronic shutter operation in an active pixel sensor array. In addition, the electronic shutter of the present invention is compatible with sensors that detect a single color per pixel as well as sensors capable of detecting multiple colors per pixel, such as the type disclosed in co-pending application Ser. No. 09/884,863, filed Jun. 18, 2001, and expressly incorporated by reference herein.

The electronic-shutter switching transistor for a CMOS image sensor is formed in a semiconductor substrate of a first conductivity type. The transistor comprises a pair of spaced apart doped regions of a second conductivity type opposite the first conductivity type disposed in the semiconductor substrate forming source/drain regions. A gate is disposed above and insulated from the semiconductor substrate and is self aligned with the pair of spaced-apart doped regions. A well of the second conductivity type laterally surrounds the pair of spaced-apart doped regions and extends deeper into the substrate than the doped regions. A buried layer of the second conductivity type underlies and is in contact with the well.

According to another aspect of the present invention, an active pixel sensor employs a transfer transistor that is isolated by a buried layer and an array of active pixel sensors employing such transfer transistors with buried-layer isolation is provided.

According to yet another aspect of the present invention, an electronic camera employs an array of active pixel sensors that use transfer transistors isolated by buried layers.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons having the benefit of this disclosure.

Figure 1:
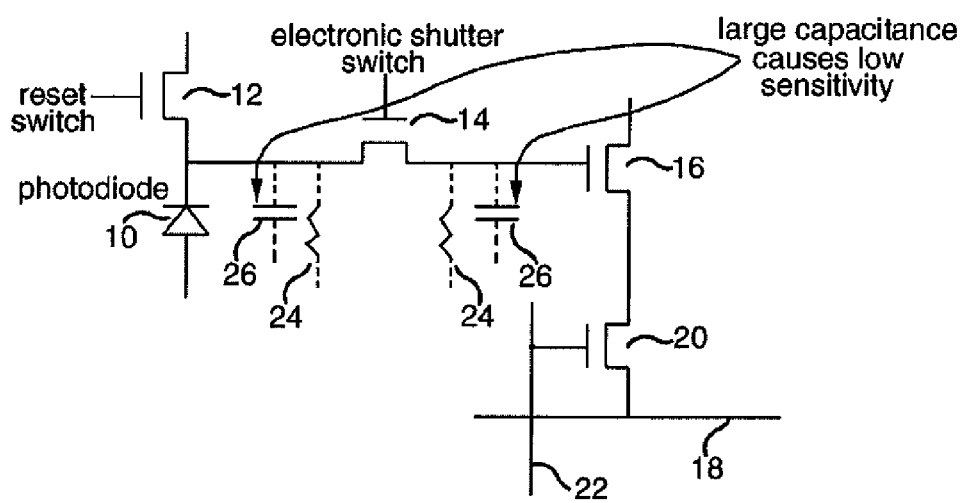
FIG. 1 is a schematic diagram of a CMOS active pixel sensor equipped with an electronic shutter of the type capable of true simultaneous electronic shutter operation.
Figure 2A:
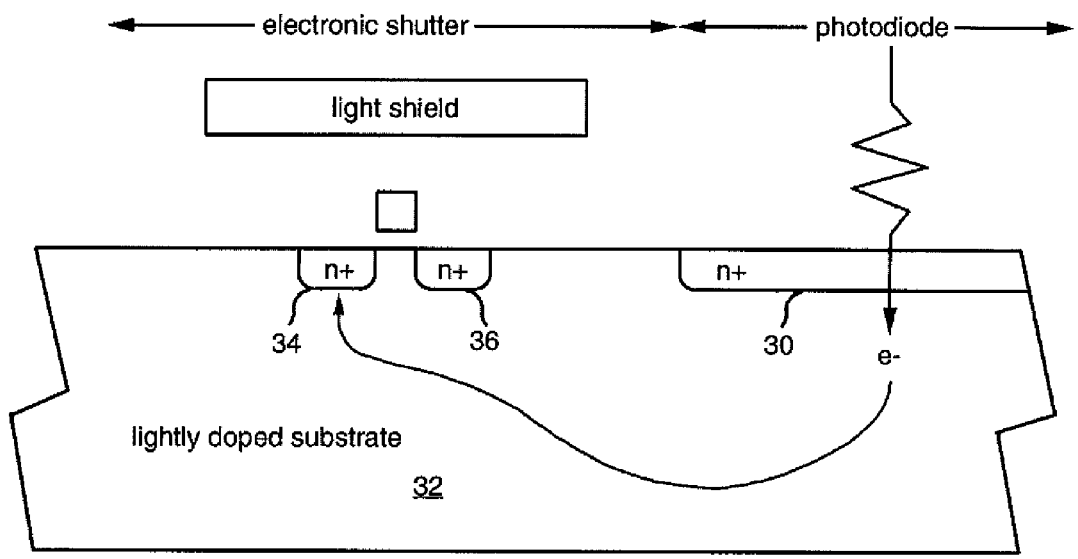
FIG. 2A is a diagram of a semiconductor cross-section of a portion of a CMOS active pixel sensor, showing the effects of failure to provide surface well isolation for the transfer transistor.
Figure 3:
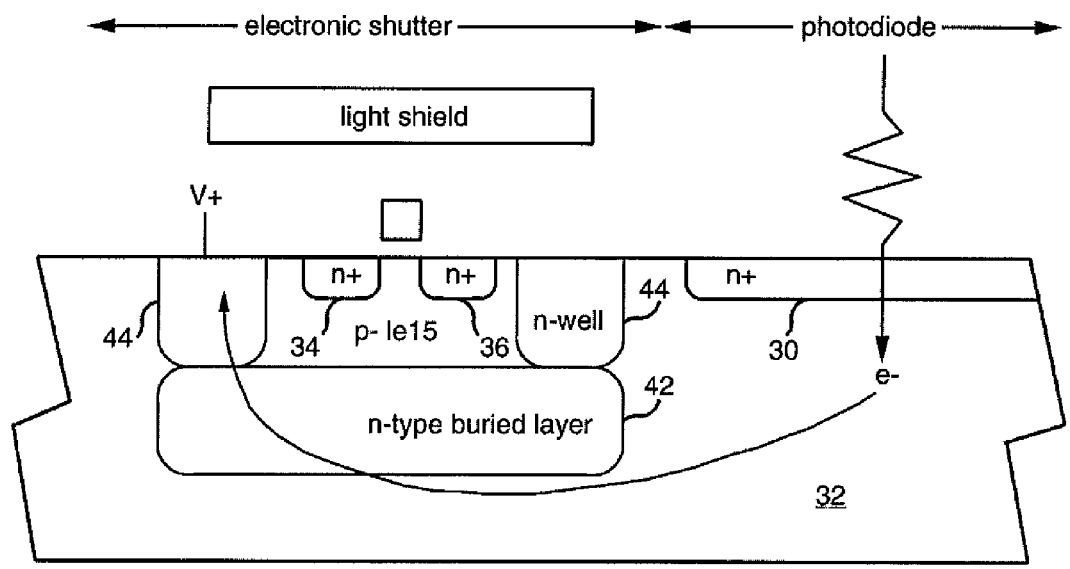
FIG. 3 is a diagram of a semiconductor cross-section of a portion of a CMOS active pixel sensor according to the present invention, showing the effects of use of an n-well and buried n-type layer as a barrier for isolation for the transfer transistor.
Figure 4:
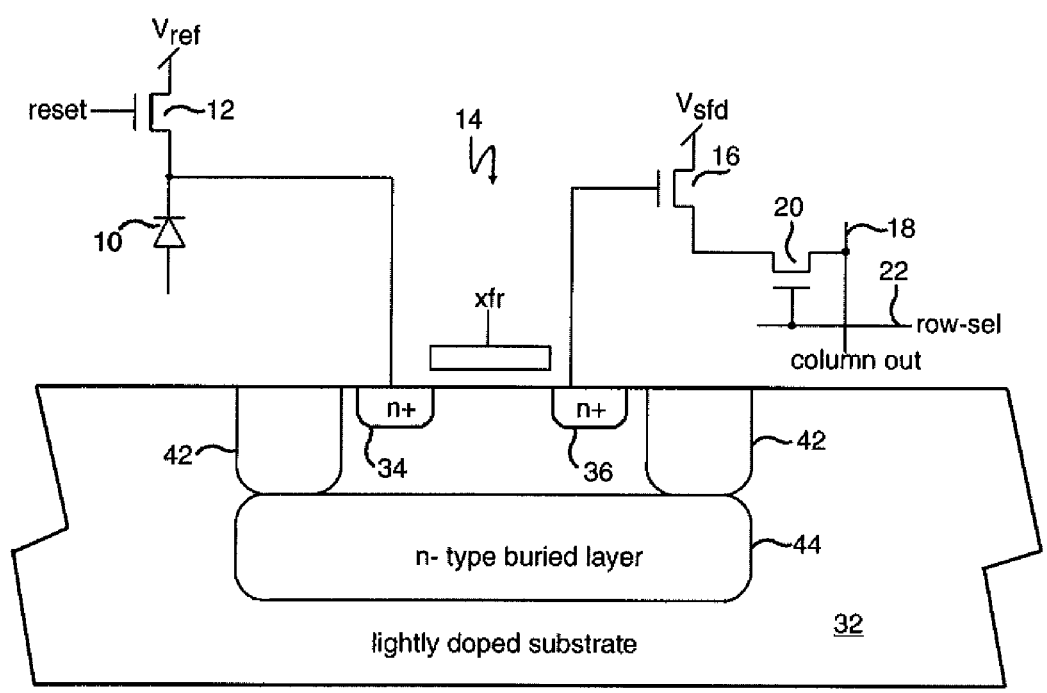
FIG. 4 is a semiconductor cross-section and schematic diagram of a portion of a CMOS active pixel sensor equipped with an electronic shutter according to the present invention.

Referring now to FIG. 3, a semiconductor cross-sectional diagram shows an electronic shutter employing a buried layer to isolate the substrate from the transfer transistor that implements the electronic shutter switch. FIG. 3 uses the same reference numerals used in FIG. 2A to identify corresponding structures.

In FIG. 3, n+ region 30 and substrate 32 form the photodiode. In FIG. 3 the n+ source/drain regions 34 and 36 of the transfer transistor are located in the lightly doped p-substrate material and are isolated from the photodiode by using an n-type buried layer 42 and a surface n-well 44 in contact with buried layer 42 and surrounding the p-region in which n+ source/drain regions 34 and 36 are located.

As will be appreciated by persons of ordinary skill in the art, the structure of FIG. 3 is compatible with existing CMOS processes used to form CMOS imaging arrays. For example, in a CMOS process having epitaxial layers, such as one in which a plurality of photodiodes are formed in a vertical structure to fabricate a vertical color filter active pixel sensor, buried layer 42 may be formed as a surface n+ diffusion in a p-type region such as a substrate or epitaxial layer. An epitaxial p-type layer is then grown over the surface of the surface n+ diffusion in a p-type region and the source/drain regions 34 and 36 of the transfer transistor as well as other n+ regions are formed in that p-type region.

In one CMOS processing example, the buried-layer transfer transistor of the present invention is incorporated into a three-color vertical color filter active pixel sensor. In this example, the buried n-type layer is formed in a p-type epitaxial layer using the same mask that is used to form the buried n+ region that will comprise the n+ region for the green photodiode.

Figure 2B:
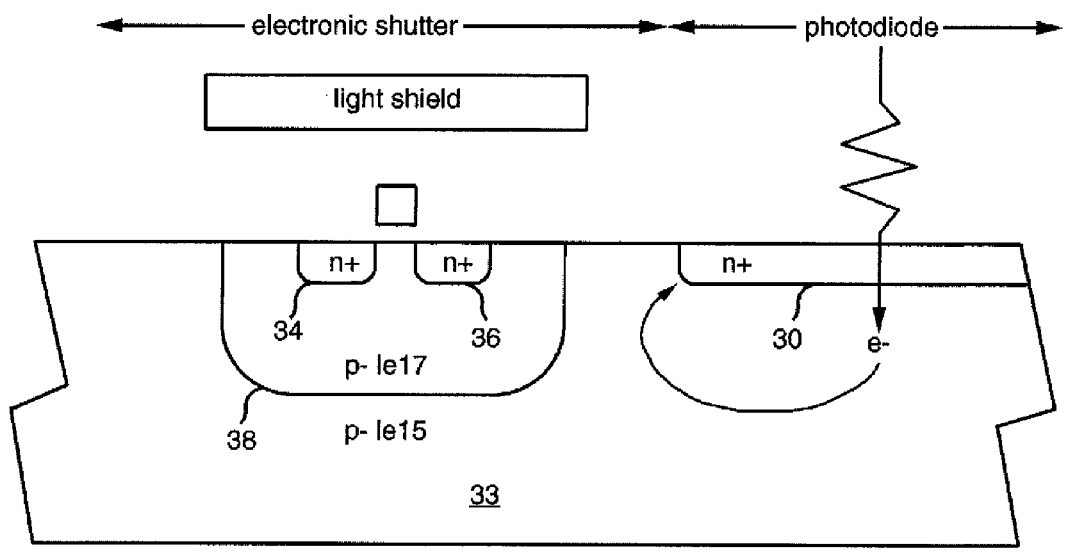
FIG. 2B is a diagram of a semiconductor cross-section of a portion of a CMOS active pixel sensor, showing the effects of use of a p-well and p-substrate barrier for isolation for the transfer transistor.
Figure 2C:
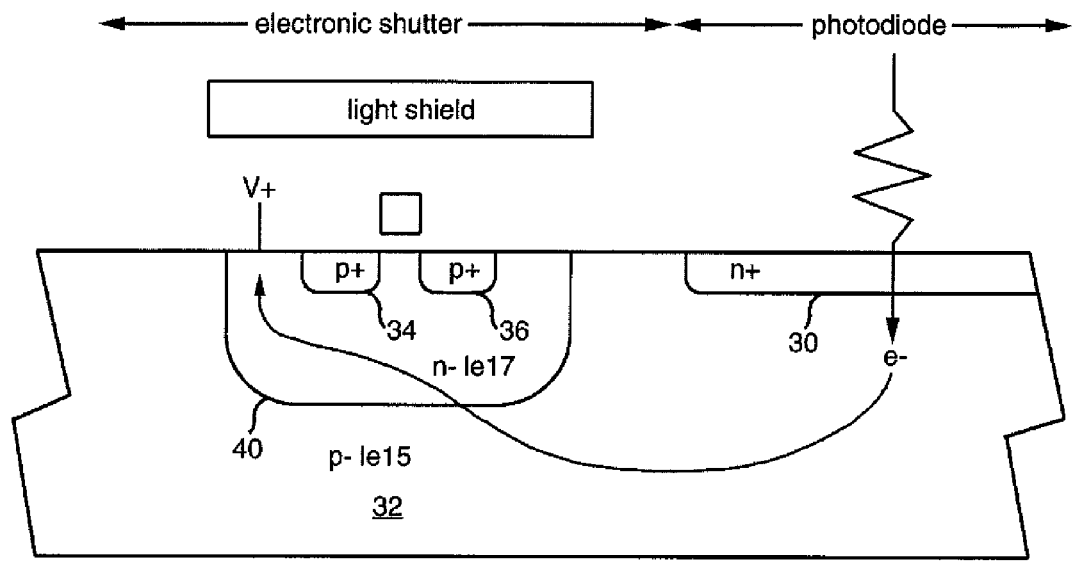
FIG. 2C is a diagram of a semiconductor cross-section of a portion of a CMOS active pixel sensor, showing the effects of use of an n-well barrier for isolation for the transfer transistor.

According to the present invention, the transfer transistor switch can be disposed in a lightly doped bulk (the substrate, doped to a level of about 1e15), resulting in low capacitance and low leakage, and also preventing corruption of the signal stored at the transfer transistor due to stray carriers. Processing is compatible with vertical color filter pixel sensors that have been shown to have excellent leakage characteristics. In addition, electrical isolation from the substrate is much better than the isolation techniques used in prior electronic shutter electronic cameras as illustrated in FIGS. 2B and 2C. Isolation from the substrate (or other layers in the case of a multiple color sensor) reduces the effect of any noise or crosstalk signals coupling into the transfer transistor switch.

An illustrative semiconductor fabrication process for fabricating the transfer transistor of the present invention along with a vertical-color-filter detector group is disclosed with reference to FIGS. 5A through 5E, cross-sectional diagrams showing the structure resulting after completion of selected steps in the process.

Figure 5A:
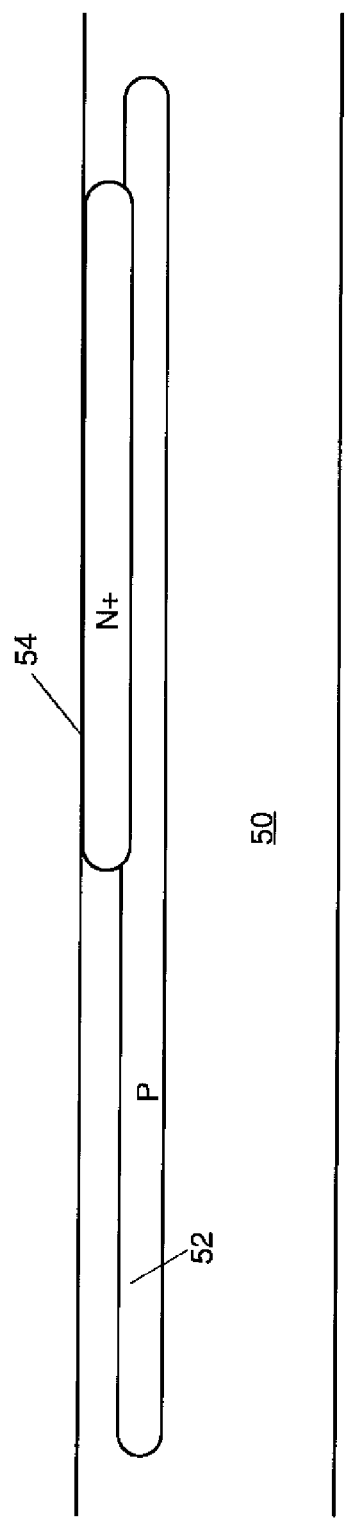
FIGS. 5A through 5E are cross-sectional diagrams illustrating the fabrication of the transfer transistor of the present invention in a three-color vertical-color-filter detector group showing the structure resulting after completion of selected steps in the fabrication process.

The process starts with a p-type substrate 50 (that may be doped to about 1e15) shown in FIG. 5A. A blanket boron implant 52 is performed to a depth of about 0.5 um. This boron implant must be more heavily doped than the substrate because it acts as weak diffusion barrier to prevent electrons generated in the substrate from diffusing up to the green photodiode, as well as separating the red photodiodes. This blanket implant should generally be anywhere from about 3× to 100× of the substrate doping level and in one embodiment of the invention is about 1e16. Next, an implant masking layer (not shown) is then applied using conventional photolithographic techniques. Next, as shown in FIG. 5A, a masked phosphorus implant that may be about 1e17 is performed at an energy of around 50 keV followed by an activation cycle as is known in the art to form the n-type layer 54 for the red detector. This implant dose should be selected to be sufficient to overcompensate the blanket p-type implant 52. Persons of ordinary skill in the art will appreciate that the drive cycle must ensure adequate annealing for both the boron and phosphorus implants prior to growth of an epitaxial silicon layer. Persons skilled in the art will also recognize that the order of the p-type blanket implant 52 and the n-type masked implant to form the red photodiode n-type region 54 could be reversed.

Figure 5B:
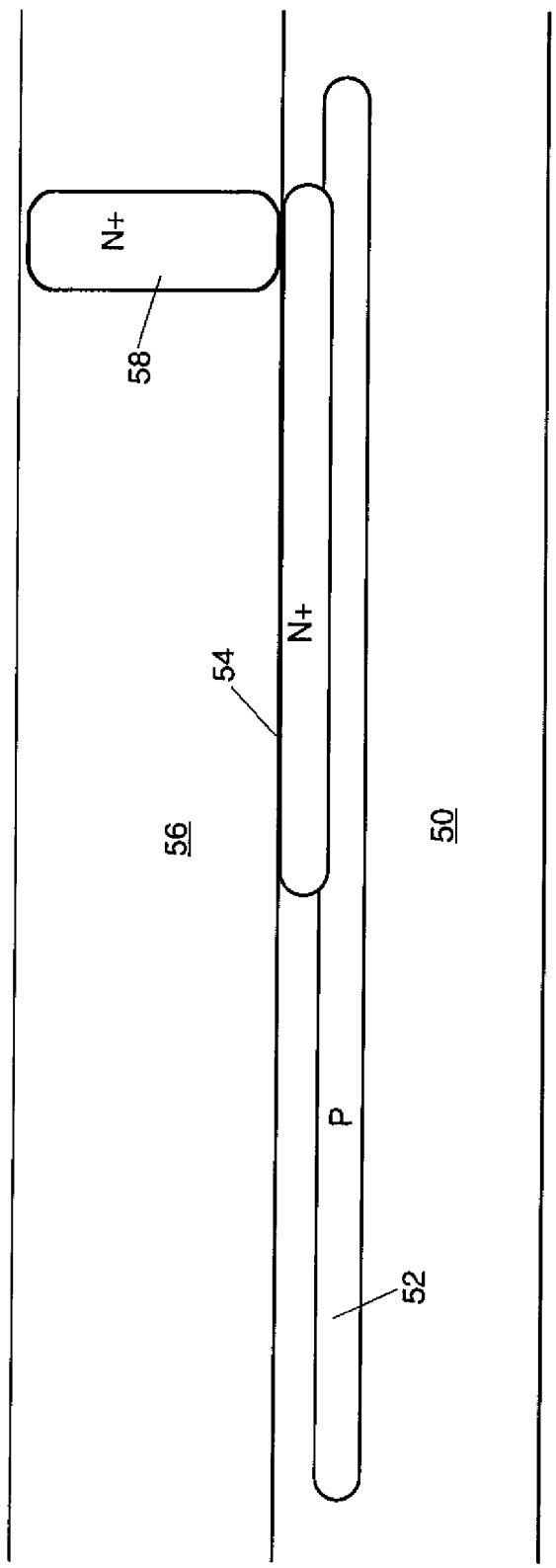

Referring now to FIG. 5B, next, a layer of p-type epitaxial silicon 56 is grown to a thickness of about 2.0 um. The dopant concentration in the epitaxial layer may be about 1e15 and is as light as will guarantee p-type material in order that it will function as a potential well region so that photo-electrons generated therein do not diffuse past the p-type layers above or below it. Punch-through from red to green photodiodes is another design constraint affecting doping level in this layer, i.e., the doping needs to be sufficient to prevent depletion regions from the red and green photodiode cathodes from getting too close to each other, or fully depleting the p-type region between them.

Next, a plug implant masking layer (not shown) is then applied using conventional photolithographic techniques. A phosphorus plug implant 58 which may be about 1e17 and an anneal sequence is then performed to form a plug contact to the cathode of the red photodiode. This plug implant should be a high-energy implant (i.e., about 1,000 KeV) or should comprise multiple implant steps at different energies. In one embodiment of the present invention, a tall, thin plug contact plug 58 is formed by a combination of two different implants, one a high-energy implant (i.e., about 1,200 KeV) for deep doping the bottom region of the plug contact, and the other a lower energy implant 100 (i.e., about 600 KeV) for doping the intermediate region of the plug contact, followed by a third implant or diffusion that is performed along with the doping for the green photodiode to complete the shallow surface region of the plug contact.

The plug resistance is not important since the photocurrent is small, however the size of the plug should be as small as possible to minimize pixel area and maximize fill factor. A plug size of 1 micron is a good target, but the depth of the plug contact needs to be about 2 microns. The multiple-implant plug disclosed herein makes it possible to achieve such a plug with a depth greater than its width.

Figure 5C:
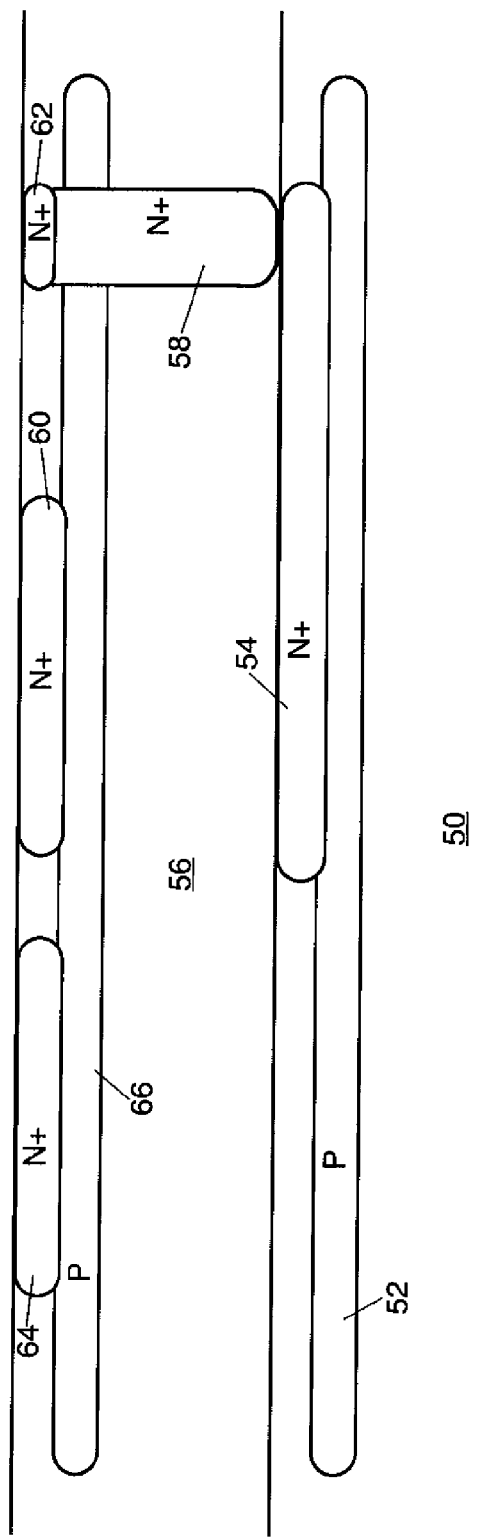

Referring now to FIG. 5C, an implant masking layer (not shown) is then applied using conventional photolithographic techniques. A phosphorus implant that may be about 1e17 at an energy of around 50 KeV and activation sequence is then performed to form the n-type layer 60 for the green detector. A second, smaller aperture in this masking layer serves to form the surface region 62 of the plug contact implant for the contact to the underlying cathode of the red detector. A third aperture in this masking layer serves to form the buried layer 64 for the transfer transistor of the present invention. As persons of ordinary skill in the art will appreciate, this implant requires activation drive to restore lattice integrity before the subsequent epitaxial layer deposition step.

Next, a blanket boron implant 66 of the epitaxial layer is performed. This implant 66 serves to counteract autodoping during the subsequent epitaxial layer deposition step. This implant 66 also serves as a weak diffusion barrier to prevent green-photon-generated carriers from diffusing upward to the blue detector and separates the green photodiodes. This blanket implant 66 should generally be anywhere from about 3× to 100× of the doping level of the first epitaxial layer and in one embodiment of the invention is about 1e16. Persons skilled in the art will also recognize that the order of the p-type blanket implant 66 and the n-type masked implant to form the green photodiode n-type region 60 could be reversed, and that the doping concentration considerations are similar to those described above for the red photodiode.

Figure 5D:
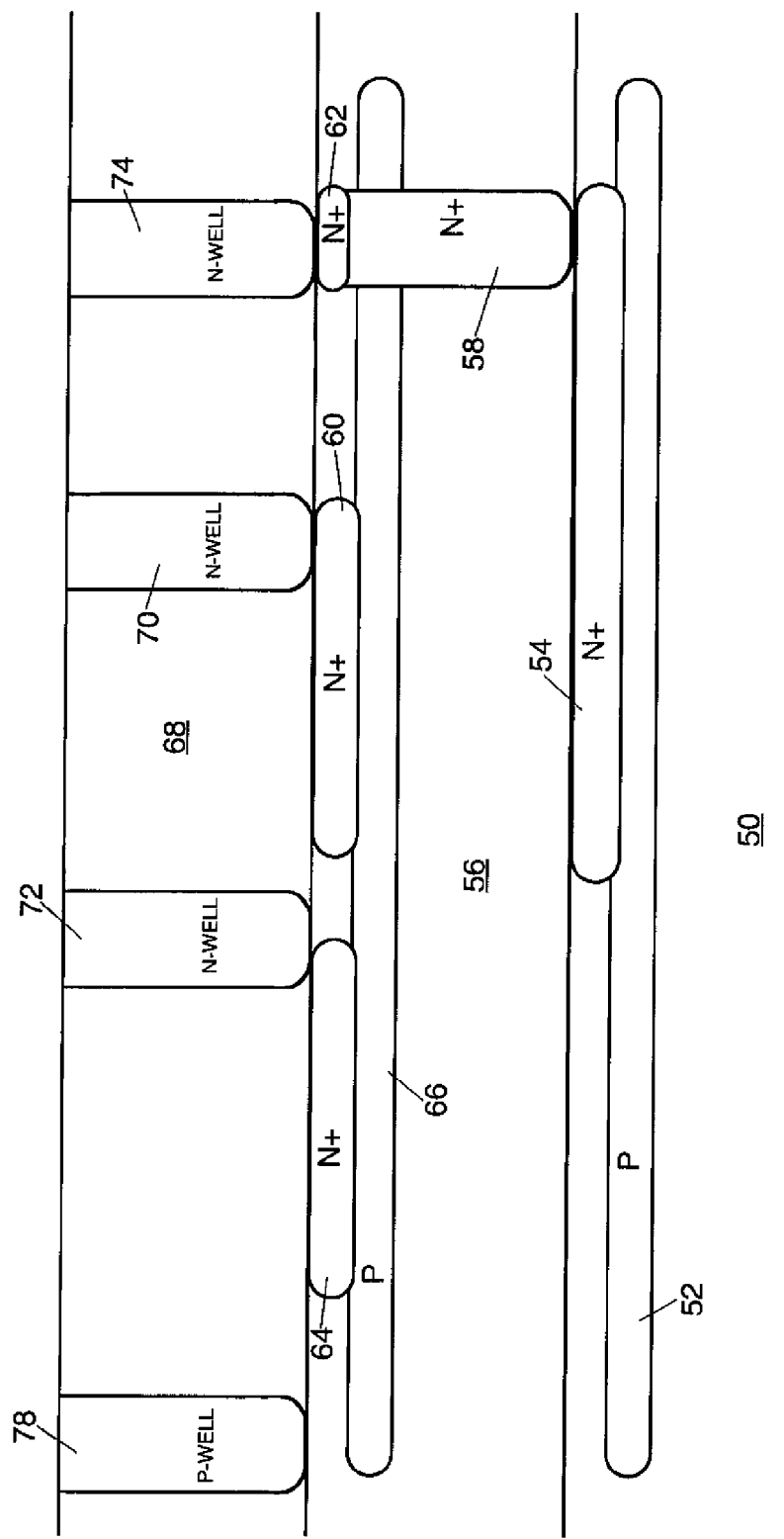

Referring now to FIG. 5D, a layer of 1e15 p-type epitaxial silicon 68 is grown to a thickness of about 0.7 to 1.0 um. An implant masking layer (not shown) is then applied using conventional photolithographic techniques. A standard CMOS n-well implant is performed to form n-well region 70 to make contact to the cathode of the underlying green detector, the annular n-well 72 for the transfer transistor, and an n-well region 74 to make contact to the top of the plug contact for the cathode of the bottom red detector. A double implant may be required to reach the buried layers comprising the cathode 60 of the green detector, the transfer transistor buried layer 64 and the plug contact 62 for the cathode of the red detector; typical CMOS n-well implant energies are around 500 KeV and 100 KeV for the deep and shallow implants in these n-well regions, respectively.

Figure 5E:
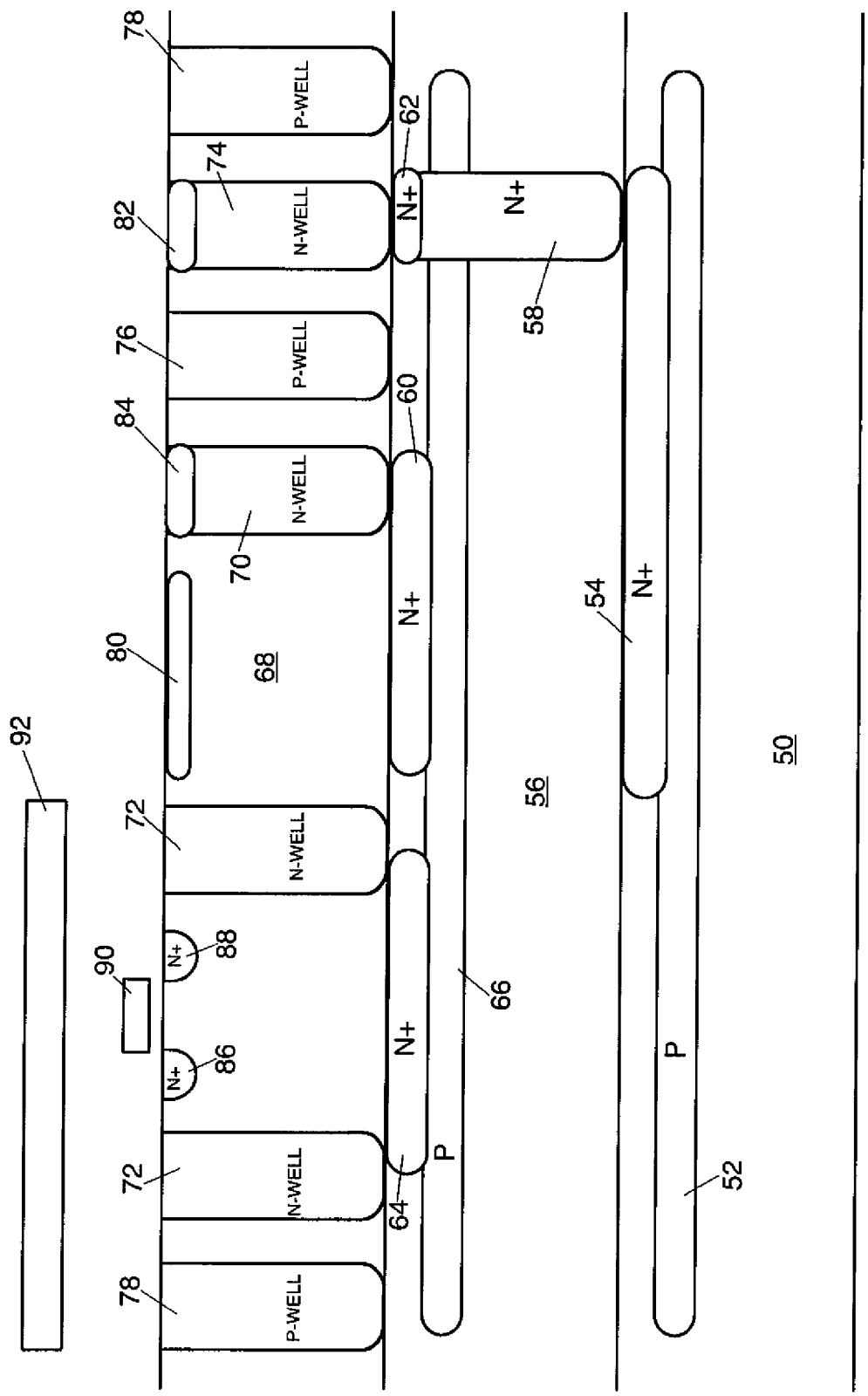

Referring now to FIG. 5E, an implant masking layer (not shown) is then applied using conventional photolithographic techniques. A CMOS p-well implant step is then performed to create p-well-regions 76 and 78. As will be understood by persons of ordinary skill in the art, the CMOS p-well implant step may require a double energy implant to minimize the n-well-to-n-well spacing. The p-well region 76 is for isolation between the contacts for the red and green detector plugs and the p-well regions 78 provide isolation between adjoining detector groups. In addition, this p-well implant is used to create wells in which NMOS transistors for the rest of the circuitry on the chip will be formed.

Next, an implant masking layer (not shown) is then applied using conventional photolithographic techniques. A lightly-doped-drain implant is then performed to form the cathode 80 of the blue detector. In one embodiment of the invention, other apertures in this masking layer form surface portions 82 and 84 of the deep contact regions for the red and green detectors, to allow good electrical contact to an overlying metal interconnect layer. Alternately, more heavily doped n-type regions may be formed in a separate processing step to form surface portions 82 and 84 of the deep contact regions for the red and green detectors as well as a contact region within the lightly-doped-drain implant 80 for the blue detector. As an optional alternative to the illustrative process depicted in FIG. 5E, the cathode 80 of the blue detector might be formed with a p-well underneath.

The source/drain regions 86 and 88 of the transfer transistor may be formed using the source/drain implant mask (usually the gates of the transistors in a self-aligned-gate process as is known in the art) for the rest of the n-channel transistors on the substrate using transfer-transistor gate 90 as a mask. Light shield 92 is formed later in the process.

Figure 6:
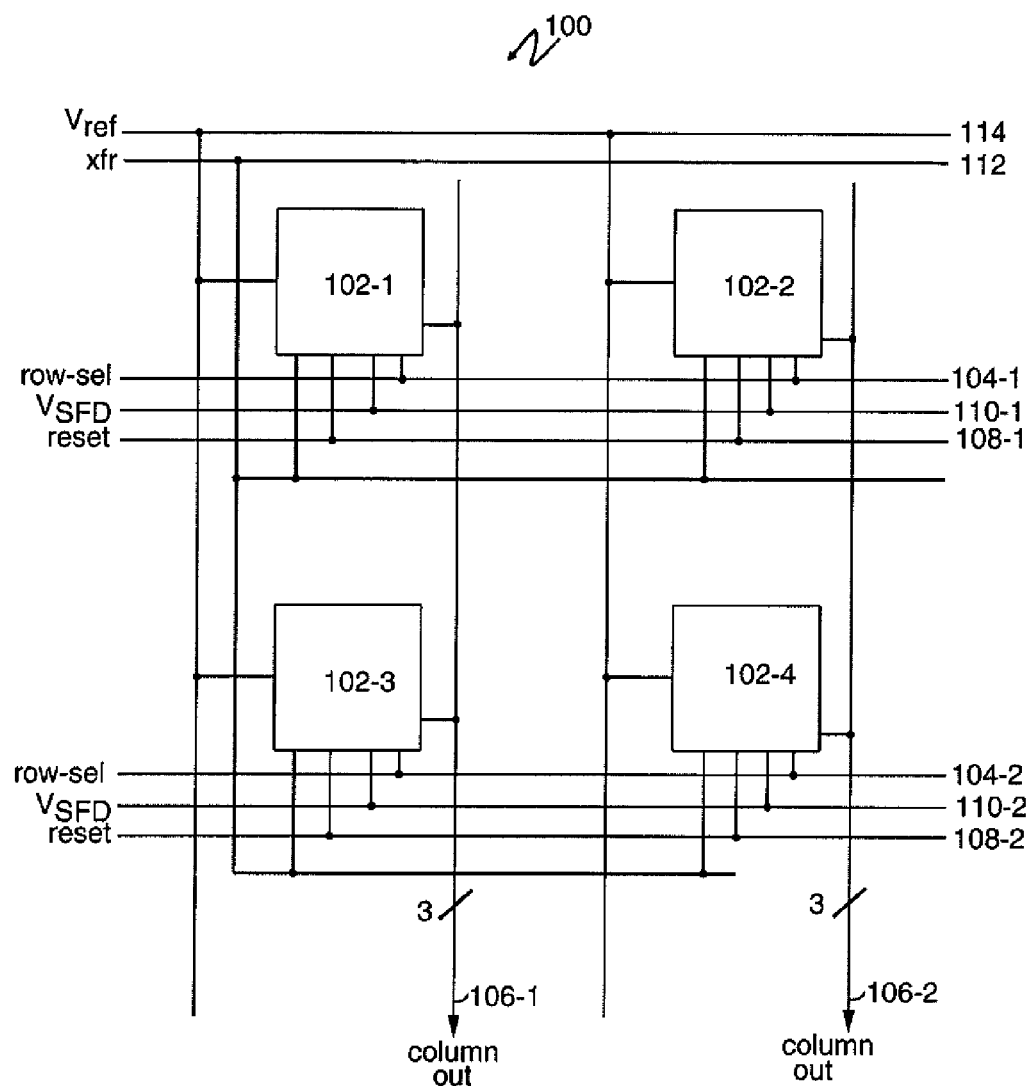
FIG. 6 is a block diagram of an array of CMOS active pixel sensors equipped with an electronic shutter according to the present invention.

Referring now to FIG. 6, a block diagram shows an illustrative array of vertical-color-filter detector groups of FIG. 5E according to the present invention. FIG. 6 shows an illustrative 2 by 2 portion 100 of an array of vertical-color-filter detector groups according to the present invention. Persons of ordinary skill in the art will readily appreciate that the array portion 100 disclosed in FIG. 6 is illustrative only and that arrays of arbitrary size may be fabricated using the teachings herein.

The 2 by 2 portion 70 of the array in FIG. 6 includes two rows and two columns of vertical-color-filter detector groups according to the present invention. A first row includes vertical-color-filter detector groups 102-1 and 102-2; a second row includes vertical-color-filter detector groups 102-3 and 102-4. A first column includes vertical-color-filter detector groups 102-1, 102-3; a second column includes vertical-color-filter detector groups 102-2 and 102-4.

A first ROW-SELECT line 104-1 is connected to the row-select inputs (ROW-SELECT) of vertical-color-filter detector groups 102-1 and 102-2. A second ROW-SELECT line 104-2 is connected to the row-select inputs (ROW-SELECT) of vertical-color-filter detector groups 102-3 and 102-4. The first and second ROW-SELECT lines may be driven from a row decoder (not shown) as is well known in the art.

A first COLUMN OUT line 106-1 is connected to the outputs of vertical-color-filter detector groups 102-1 and 102-3. A second COLUMN OUT line 106-2 is connected to the outputs of vertical-color-filter detector groups 102-2 and 102-4. The first and second COLUMN OUT lines are coupled to column readout circuits (not shown) as is well known in the art.

A first RESET line 108-1 is connected to the reset (R) inputs of all of the vertical-color-filter detector groups 102-1 and 102-2 in the first row of the array. A second RESET line 108-2 is connected to the reset (R) inputs of all of the vertical-color-filter detector groups 102-3 and 102-4 in the second row of the array.

A $V_{SFD}$ line 110-1 is connected to the $V_{SFD}$ inputs of the vertical-color-filter detector groups 102-1 and 102-2 in the first row of the array. A second $V_{SFD}$ line 110-2 is connected to the VSFD inputs of the vertical-color-filter detector groups 102-3 and 102-4 in the second row of the array.

A global XFR line 112 for the transfer transistors is connected to the XFR inputs of all of the vertical-color-filter detector groups 102-1 through 102-4. Alternately, multiple XFR lines (one for each row) could be provided to implement noise cancellation methods. A global $V_{ref}$ line 114 for the reset transistors is connected to the $V_{ref}$ inputs of all of the vertical-color-filter detector groups 102-1 through 102-4. Alternately, multiple $V_{ref}$ lines (one for each column) could be provided.

Figure 7:
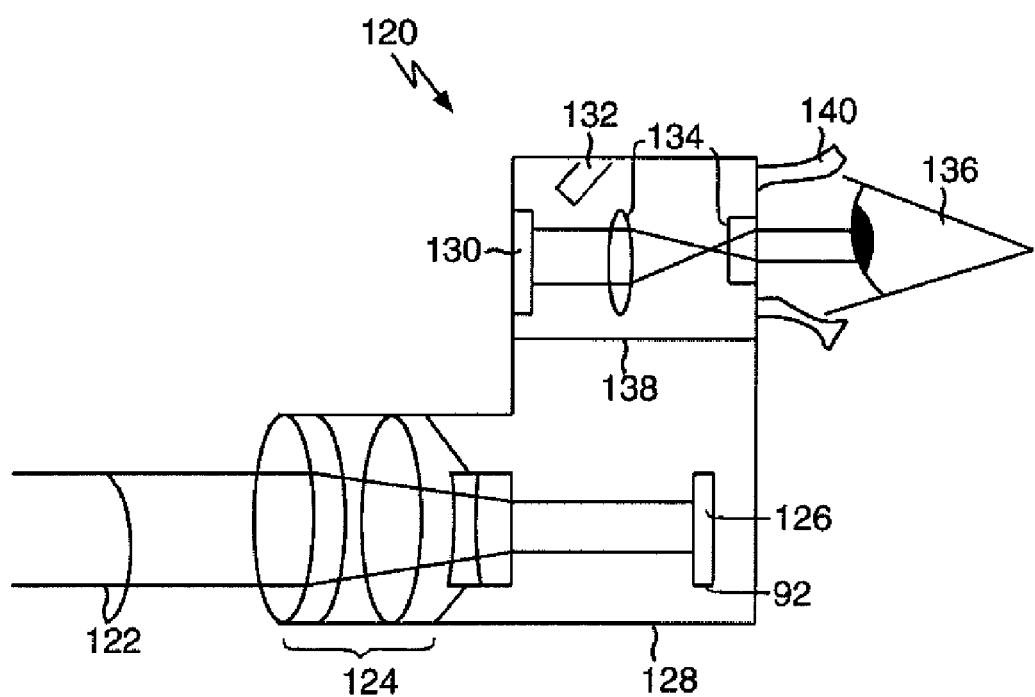
FIG. 7 is a diagram of an electronic camera including an array of CMOS active pixel sensors equipped with an electronic shutter according to the present invention.

A preferred digital still camera 120 encompassing the present invention is illustrated in FIG. 7. Rays of light 122 from a scene to the left of the figure are focused by primary optical system 124 onto a sensor chip 126 containing an array of Vertical-color-filter detector groups according to the present invention. Optical system 124 and sensor chip 126 are housed within light-tight housing 128 to prevent stray light from falling on sensor chip 126 and thereby corrupting the image formed by rays 122. An electronic system, not illustrated in FIG. 7, takes electrical signals from sensor chip 126 and derives electrical signals suitable for driving display chip 130, which can be either of the micro-machined reflective type as supplied by Texas Instruments, or of the liquid-crystal coated type, as supplied by micro-display vendors such as Kopin or MicroDisplay Corp. Persons of ordinary skill in the art will appreciate that an ordinary LCD panel may also be used for this purpose.

Display chip 130 is illuminated by light-emitting-diode (LED) array 132. Reflected light from display chip 130 is focused by secondary optical system 134 in such a manner that images can be viewed by the eye 136 of the user of the camera. Alternatively, display chip 130 can be an organic light-emitting array, in which it produces light directly and does not require LED array 132. Both technologies give bright displays with excellent color saturation and consume very little power, thus being suitable for integration into a compact camera housing as illustrated in FIG. 7. A light-tight baffle 138 separates the chamber housing sensor chip 126 from that housing LED array 132, display chip 130, and secondary optical system 134. Viewing the image from display chip 130 in bright sunlight is made easier by providing rubber or elastomer eye cup 140.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An electronic shutter switching transistor for a CMOS electronic image capture device formed in a semiconductor substrate of a first conductivity type and comprising:
    a pair of spaced apart doped regions of a second conductivity type opposite said first conductivity type disposed in the semiconductor substrate forming source/drain regions;
    a gate disposed above and insulated from said semiconductor substrate and self aligned with said pair of spaced apart doped regions;
    a well of said second conductivity type laterally surrounding said pair of spaced apart doped regions and extending deeper into said substrate than said doped regions; and
    a buried layer of said second conductivity type underlying and in contact with said well.

2. The electronic shutter switching transistor of claim 1 wherein said substrate is doped to a level of about 1e15 with a p-type dopant, said spaced-apart doped regions are doped n+, and said well and said buried region are n-type.

3. An electronic shutter switching transistor for a CMOS electronic image capture device formed in a p-type semiconductor substrate comprising:
    a pair of spaced apart n+ doped regions disposed in the semiconductor substrate forming source/drain regions;
    a gate disposed above and insulated from said semiconductor substrate and self aligned with said pair of spaced apart doped regions;
    an n-well laterally surrounding said pair of spaced apart n+ doped regions and extending deeper into said substrate than said n+ doped regions; and
    an n-type buried layer underlying and in contact with said n-well.

4. A method for fabricating an electronic shutter switching transistor for a CMOS electronic image capture device formed in a semiconductor substrate of a first conductivity type comprising;

forming a buried layer in the substrate of a second conductivity type opposite to said first conductivity type;

forming an annular well of said second conductivity type, said well extending into said substrate and in contact with said buried region;

forming a gate disposed above and insulated from said semiconductor substrate; and forming a pair of spaced apart doped regions of said second conductivity type self-aligned to said gate and disposed in said substrate and surrounded by but not within said annular well;

and self aligned with said pair of spaced apart doped regions.

5. The method of claim 4 wherein forming said buried layer in said substrate comprises:

doping a region at a surface of a semiconductor material of said first conductivity type with a dopant of said second conductivity type; and growing an epitaxial layer of said first conductivity type over said surface of said semiconductor material.

6. A method for fabricating an electronic shutter switching transistor for a CMOS electronic image capture device formed in a p-type semiconductor substrate comprising:

forming an n-type buried layer in a p-type substrate;

forming an annular n-well extending into said substrate and in contact with said buried region;

forming a gate disposed above and insulated from said semiconductor substrate;

forming a pair of spaced apart n+ doped regions self-aligned to said gate and disposed in said substrate and surrounded by but not within said annular n-well; and self aligned with said pair of spaced apart doped regions.

7. The method of claim 4 wherein forming said n-type buried layer in said p-type substrate comprises:

doping a region at a surface of a p-type semiconductor material with a n-type dopant; and growing a p-type epitaxial layer over said surface of said p-type semiconductor material.

8. An active pixel sensor disposed in a semiconductor substrate of a first conductivity type comprising:

a photodetector;

a reset transistor having a source coupled to said photodetector, a gate coupled to a reset signal line, and a drain coupled to a reset reference potential;

a transfer transistor having a drain coupled to said source of said reset transistor, a gate coupled to a transfer signal line, and a source, said drain and said source disposed in said substrate and being of a second conductivity type opposite to that of said first conductivity type, said drain and source being laterally surrounded by a well of said second conductivity type and having a buried layer of said second conductivity type underlying and in contact with said well;

a source-follower transistor having a gate coupled to said source of said transfer transistor, a drain coupled to a drain supply potential, and a source; and a row-select transistor having a drain coupled to said source of said source-follower transistor, a source coupled to a column output line, and a gate coupled to a row-select signal line.

9. The active pixel sensor of claim 8, wherein said photodetector is one of a plurality of photodiodes disposed at different vertical depths in said substrate and further wherein said buried layer is formed simultaneously with a second buried layer of said second conductivity type that forms a portion of one of said photodiodes.

10. An active pixel sensor disposed in a p-type semiconductor substrate comprising:

a photodetector;

a reset transistor having a source coupled to said photodetector, a gate coupled to a reset signal line, and a drain coupled to a reset reference potential;

a transfer transistor having a drain coupled to said source of said reset transistor, a gate coupled to a transfer signal line, and a source, said drain and said source being n-type and disposed in said substrate, said drain and source being laterally surrounded by an n-well and having an n-type buried layer underlying and in contact with said n-well;

a source-follower transistor having a gate coupled to said source of said transfer transistor, a drain coupled to a drain supply potential, and a source; and a row-select transistor having a drain coupled to said source of said source-follower transistor, a source coupled to a column output line, and a gate coupled to a row-select signal line.

11. The active pixel sensor of claim 10, wherein said photodetector is one of a plurality of photodiodes disposed at different vertical depths in said substrate and further wherein said n-type buried layer is formed simultaneously with a second n-type buried layer that forms a cathode of one of said photodiodes.

12. A vertical color filter detector group and an electronic shutter switching transistor for a CMOS electronic image capture device formed on a semiconductor substrate of a first conductivity type comprising:

a first well of a second conductivity type opposite said first conductivity type formed in the substrate;

a first epitaxial layer of said first conductivity type formed over an upper surface of said semiconductor substrate;

a second well of said second conductivity type formed in said first epitaxial layer in substantial vertical alignment with said first well;

a second epitaxial layer of said first conductivity type formed over an upper surface of said first epitaxial layer;

a shallow diffusion of said second conductivity type formed in said second epitaxial layer in substantial vertical alignment with said first well;

a third well of said second conductivity type formed in said first epitaxial layer and spaced apart from said second well;

an annular well of said second conductivity type formed in said second epitaxial layer, said annular well in contact with said third well and substantially vertically aligned therewith;

a pair of spaced-apart source/drain regions of said second conductivity type disposed in said second epitaxial layer and surrounded by but not within said annular well; and a gate disposed above and insulated from said semiconductor substrate and self aligned with said pair of spaced apart doped regions;

wherein said substrate and said first and second epitaxial regions are coupled to a reference potential.

13. The vertical color filter detector group and electronic shutter switching transistor of claim 12 wherein said first conductivity type is p and said second conductivity type is n.

14. An array of active pixel sensors disposed in a plurality of rows and columns on a semiconductor substrate of a first conductivity type comprising:
- a reset signal line;
- a reset-reference-voltage line;
- a transfer signal line;
- a source-follower drain-potential supply line;
- a row-select line for each row in the array;
- a column-output line for each column in the array;
- a plurality of active pixel sensors, each active pixel sensor associated with a row and a column in the array and comprising:
  - a photodetector;
  - a reset transistor having a source coupled to said photodetector, a gate coupled to said reset signal line, and a drain coupled to said reset-reference-voltage line;
  - a transfer transistor having a drain coupled to said source of said reset transistor, a gate coupled to said transfer signal line, and a source, said drain and said source disposed in said substrate and being of a second conductivity type opposite to that of said first conductivity type, said drain and source being laterally surrounded by a well of said second conductivity type and having a buried layer of said second conductivity type underlying and in contact with said well;
  - a source-follower transistor having a gate coupled to said source of said transfer transistor, a drain coupled to said source-follower drain-potential supply line, and a source; and
  - a row-select transistor having a drain coupled to said source of said source-follower transistor, a source coupled to a column output line with which its pixels sensor is associated, and a gate coupled to a row-select signal line with which its pixel sensor is associated.

15. The array of claim 14, wherein said in each said pixel sensor photodetector is one of a plurality of photodiodes disposed at different vertical depths in said substrate and further wherein said buried layer is formed simultaneously with a second buried layer of said second conductivity type that forms a portion of one of said photodiodes.

16. An array of active pixel sensors disposed in a plurality of rows and columns on a semiconductor substrate of a first conductivity type comprising:
- a reset signal line;
- a reset-reference-voltage line;
- a transfer signal line;
- a source-follower drain-potential supply line;
- a row-select line for each row in the array;
- a column-output line for each column in the array;
- a plurality of active pixel sensors, each active pixel sensor associated with a row and a column in the array and comprising:
  - a photodetector;
  - a reset transistor having a source coupled to said photodetector, a gate coupled to said reset signal line, and a drain coupled to a reset-reference-voltage line;
  - a transfer transistor having a drain coupled to said source of said reset transistor, a gate coupled to said transfer signal line, and a source, said drain and said source being n-type and disposed in said substrate, said drain and source being laterally surrounded by an n-well and having an n-type buried layer underlying and in contact with said n-well;
  - a source-follower transistor having a gate coupled to said source of said transfer transistor, a drain coupled to said source-follower drain-potential supply line, and a source; and
  - a row-select transistor having a drain coupled to said source of said source-follower transistor, a source coupled to a column output line with which its pixel sensor is associated, and a gate coupled to a row-select signal line with which its pixel sensor is associated.

17. The array of claim 16, wherein said photodetector in each said pixel sensor is one of a plurality of photodiodes disposed at different vertical depths in said substrate and further wherein said n-type buried layer is formed simultaneously with a second n-type buried layer that forms a cathode of one of said photodiodes.

18. A vertical-color-filter detector group and an electronic shutter switching transistor for a CMOS electronic image capture device formed on a semiconductor substrate of a first conductivity type comprising:
- a first region of a second conductivity type opposite said first conductivity type formed in the substrate;
- a first epitaxial layer of said first conductivity type formed over an upper surface of said semiconductor substrate;
- a second region of said second conductivity type formed in said first epitaxial layer in substantial vertical alignment with said first region;
- a second epitaxial layer of said first conductivity type formed over an upper surface of said first epitaxial layer;
- a shallow diffusion of said second conductivity type formed in said second epitaxial layer in substantial vertical alignment with said first region;
- a third region of said second conductivity type formed in said first epitaxial layer and spaced apart from said second region;
- an annular well of said second conductivity type formed in said second epitaxial layer, said annular well in contact with said third well and substantially vertically aligned therewith;
- a pair of spaced-apart source/drain regions of said second conductivity type disposed in said second epitaxial layer and surrounded by but not within said annular well; and
- a gate disposed above and insulated from said semiconductor substrate and self aligned with said pair of spaced apart doped regions;
- wherein said substrate and said first and second epitaxial regions are coupled to a reference potential.

19. The vertical-color-filter detector group and electronic shutter switching transistor of claim 18 wherein said first conductivity type is p and said second conductivity type is n.

20. An array of vertical-color-filter detector groups and electronic shutter switching transistors disposed in a plurality of rows and columns on a semiconductor substrate of a first conductivity type comprising:
- a reset signal line;
- a reset-reference-voltage line;
- a transfer signal line;
- a source-follower drain-potential supply line;
- a row-select line for each row in the array;
- a column-output line for each column in the array;
- a plurality of vertical-color-filter detector groups, each vertical-color-filter detector group associated with a row and a column in the array and comprising:

a first region of a second conductivity type opposite said first conductivity type formed in the substrate;

a first epitaxial layer of said first conductivity type formed over an upper surface of said semiconductor substrate;

a second region of said second conductivity type formed in said first epitaxial layer in substantial vertical alignment with said first region;

a second epitaxial layer of said first conductivity type formed over an upper surface of said first epitaxial layer;

a shallow diffusion of said second conductivity type formed in said second epitaxial layer in substantial vertical alignment with said first region;

a third region of said second conductivity type formed in said first epitaxial layer and spaced apart from said second region;

three reset transistors, each having a source coupled to a different one of said first, second, and third regions, a gate coupled to said reset signal line, and a drain coupled to a reset-reference-voltage line;

three transfer transistors, each having a drain coupled to the source of a different one of said reset transistors, a gate coupled to said transfer signal line, and a source, said drain and said source being of said second conductivity type and disposed in said substrate, said drain and source being laterally surrounded by a well of said second conductivity type and having an buried layer of said second conductivity type underlying and in contact with said well;

three source-follower transistors, each having a gate coupled to the source of a different one of said transfer transistors, a drain coupled to said source-follower drain-potential supply line, and a source; and three row-select transistors, each having a drain coupled to the source of a different one of said source-follower transistors, a source coupled to a color column output line with which its vertical-color-filter detector is associated, and a gate coupled to a row-select signal line with which its vertical-color-filter detector is associated.

21. The array of claim 20, wherein said photodetector in each said pixel sensor is one of a plurality of photodiodes disposed at different vertical depths in said substrate and further wherein said n-type buried layer is formed simultaneously with a second n-type buried layer that forms a cathode of one of said photodiodes.

22. An image-capture device comprising:

a lens system including at least one lens and having an optical axis and a focal plane;

a semiconductor sensor array located on said optical axis at said focal plane of said lens system, said semiconductor sensor array having an array of active pixel sensors disposed in a plurality of rows and columns on a semiconductor substrate of a first conductivity type, each of said pixel sensors generating an output signal that is a function of light incident thereon and comprising:

a reset signal line;

a reset-reference-voltage line;

a transfer signal line;

a source-follower drain-potential supply line;

a row-select line for each row in the array;

a column-output line for each column in the array;

a plurality of active pixel sensors, each active pixel sensor associated with a row and a column in the array and comprising:

a photodetector;

a reset transistor having a source coupled to said photodetector, a gate coupled to said reset signal line, and a drain coupled to said reset-reference-voltage line;

a transfer transistor having a drain coupled to said source of said reset transistor, a gate coupled to said transfer signal line, and a source, said drain and said source disposed in said substrate and being of a second conductivity type opposite to that of said first conductivity type, said drain and source being laterally surrounded by a well of said second conductivity type and having a buried layer of said second conductivity type underlying and in contact with said well;

a source-follower transistor having a gate coupled to said source of said transfer transistor, a drain coupled to said source-follower drain-potential supply line, and a source; and a row-select transistor having a drain coupled to said source of said source-follower transistor, a source coupled to a column output line with which its pixels sensor is associated, and a gate coupled to a row-select signal line with which its pixel sensor is associated;

a sensor control circuit coupled to said semiconductor sensor array and adapted to produce sensor control signals for controlling an operation of said pixels in said semiconductor sensor array in response to input from a user of said camera system; and a viewer coupled to said semiconductor sensor array.

* * * * *